(12) United States Patent
Jaunay et al.

(10) Patent No.: US 8,586,419 B2
(45) Date of Patent: Nov. 19, 2013

(54) SEMICONDUCTOR PACKAGES INCLUDING DIE AND L-SHAPED LEAD AND METHOD OF MANUFACTURE

(75) Inventors: Serge Jaunay, Sunnyvale, CA (US); Suresh Belani, Los Altos, CA (US); Frank Kuo, Kaohsiung (TW); Sen Mao, Kaohsiung (TW); Peter Wang, Kaohsiung (TW)

(73) Assignee: Vishay-Siliconix, Santa Clara, CA (US)

( * ) Notice: Subject to any disclaimer, the term of this patent is extended or adjusted under 35 U.S.C. 154(b) by 415 days.

(21) Appl. No.: 12/730,230

(22) Filed: Mar. 24, 2010

(65) Prior Publication Data

US 2011/0175217 A1    Jul. 21, 2011

Related U.S. Application Data

(60) Provisional application No. 61/296,471, filed on Jan. 19, 2010.

(51) Int. Cl.
    *H01L 21/00* (2006.01)
(52) U.S. Cl.
    USPC ..... 438/123; 438/124; 257/670; 257/E21.506
(58) Field of Classification Search
    USPC .......... 438/123, 124; 257/666, 670, E21.502, 257/E21.506
    See application file for complete search history.

(56) References Cited

U.S. PATENT DOCUMENTS

| 7,132,734 | B2 * | 11/2006 | Johnson ................ | 257/667 |
| 7,238,551 | B2 * | 7/2007 | Kasem et al. .............. | 438/123 |
| 2004/0063240 | A1 * | 4/2004 | Madrid et al. ............... | 438/106 |
| 2007/0132073 | A1 * | 6/2007 | Tiong et al. .................. | 257/666 |
| 2008/0211070 | A1 | 9/2008 | Sun et al. | |
| 2008/0233679 | A1 * | 9/2008 | Luo et al. ...................... | 438/114 |
| 2009/0121331 | A1 * | 5/2009 | Cruz ............................ | 257/676 |

* cited by examiner

*Primary Examiner* — Tuan N. Quach

(57) ABSTRACT

The present technology is directed toward semiconductors packaged by electrically coupling a plurality of die to an upper and lower lead frame. The opposite edges of each corresponding set of leads in the upper lead frame are bent. The leads in the upper lead frame are electrically coupled between respective contacts on respective die and respective lower portion of the leads in the lower lead frame. The bent opposite edges of each corresponding set of leads of the upper lead frame support the upper lead frame before encapsulation, for achieving a desired position of the plurality of die between the leads of the upper and lower lead frames in the packaged semiconductor. After the encapsulated die are separated, the upper leads have an L-shape and electrically couple die contacts on upper side of the die to leads on the lower side of the die so that the package contacts are on the same side of the semiconductor package.

16 Claims, 6 Drawing Sheets

SEMICONDUCTOR PACKAGES INCLUDING DIE AND L-SHAPED LEAD AND METHOD OF MANUFACTURE

CROSS-REFERENCE TO RELATED APPLICATIONS

This application claims the benefit of U.S. Provisional Patent Application No. 61/296,471 filed Jan. 19, 2010.

BACKGROUND OF THE INVENTION

A number of semiconductor die include terminals on opposite sides of the die. For example, vertical power MOSFETs, whether of the planar or trench-gated variety, typically have source and gate terminal on the front side of the die and a drain terminal on the back side of the die. However, for compact, easy and economical manufacturing of devices including such semiconductors die, it is advantageous for the die to be packaged such that all the terminals are on the same side of the package.

A conventional package including a die that is interposed flip-chip style, between an upper and lower lead frame is shown in FIG. 1. One or more lower leads 110, 115, from a lower lead frame (not shown), are electrically coupled to terminals on the bottom surface of the die 130. The upper lead 135, from an upper lead frame (not shown), includes a center portion electrically coupled to a top side of the die 130 and opposite edges, that are bent downward around the die in a 'u' shape or cup shape, electrically coupled to a plurality of respective lower leads 120, 125. The terminals of the die 130 are electrically coupled to the lead 110, 115, 135 by means of solder layers. The die 130 and portions of upper and lower lead 110-125, 130 are then encapsulated. The bent down edges of the upper lead 135 contact multiple lower leads 120, 125, so that all of the external package contacts are coplanar allowing the package to be surface mounted on a printed circuit board.

SUMMARY OF THE INVENTION

The present technology may best be understood by referring to the following description and accompanying drawings that are used to illustrate embodiment of the present technology. In one embodiment, a semiconductor package includes a die, a plurality of lower leads and one or more upper leads. The one or more of the lower leads are electrically coupled to a die contact on a first side of the die. The one or more upper leads have an L-shape and are each electrically coupled to a respective die contact on a second side of the die and respective other lower leads so that package contacts are on a first side of the semiconductor package.

In another implementation, a method of packaging a semiconductor includes electrically coupling one or more contacts on a first surface of each of a plurality of die to a respective one of a plurality of leads of a lower lead frame. The opposite edges of each corresponding set of leads of an upper lead frame are bent and then the leads of the upper lead frame are electrically coupled between respective contacts on a second surface of each respective die and another respective one of the plurality of leads of the lower lead frame. The bent opposite edges of each corresponding set of leads of the upper lead frame support the upper lead frame before encapsulation, for achieving a desired position of the plurality of die between the leads of the upper and lower lead frames in the packaged semiconductor.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Embodiments of the present technology are directed toward a flip-chip style semiconductor package including a die, one or more lower leads and one or more upper 'L' shaped leads, and a method of manufacturing.

Figure 1:
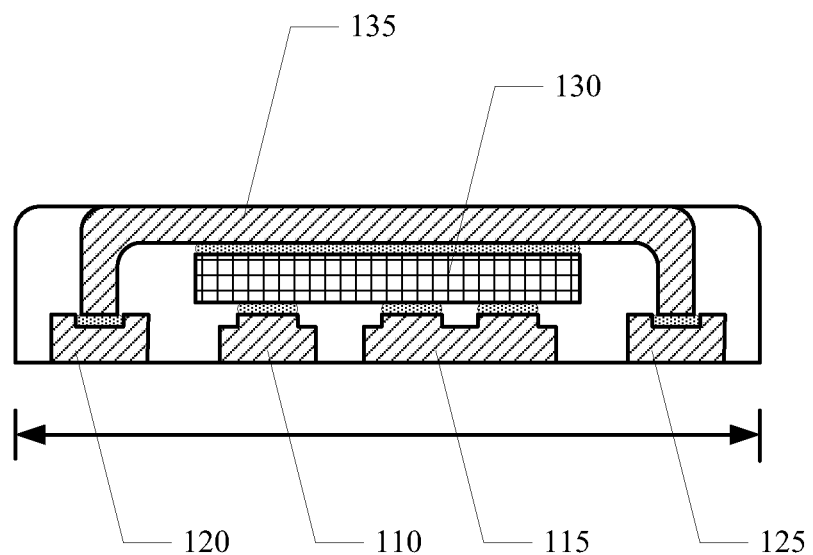
FIG. 1 shows a side view of semiconductor package including a die that is interposed flip-chip style, between an upper and lower lead frame, according to the conventional art.
Figure 2A:
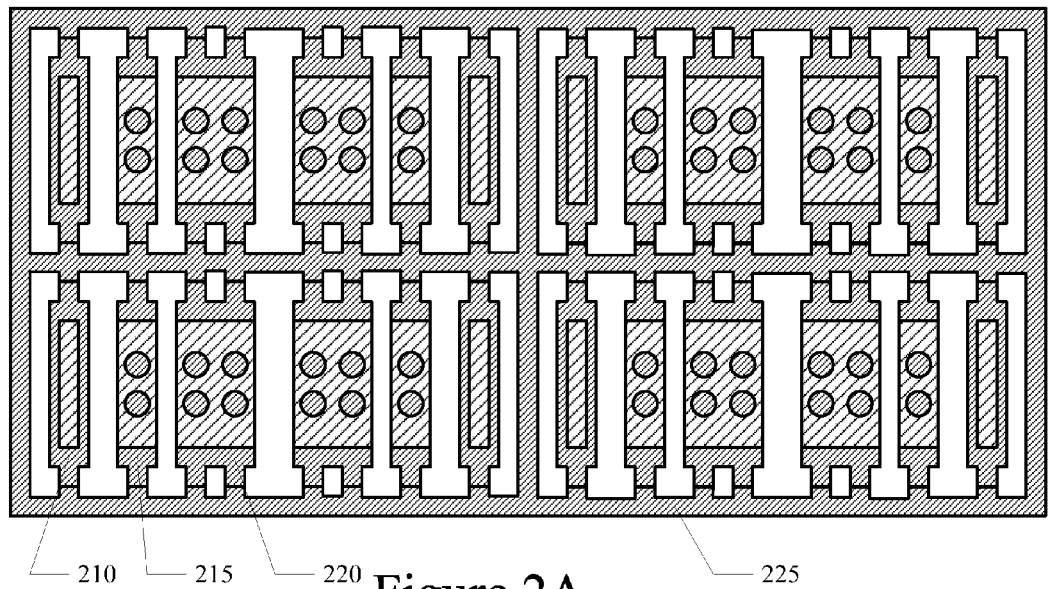
FIGS. 2A and 2B show a plane view of an exemplary upper and lower lead frame, in accordance with one embodiment of the present technology.
Figure 2B:
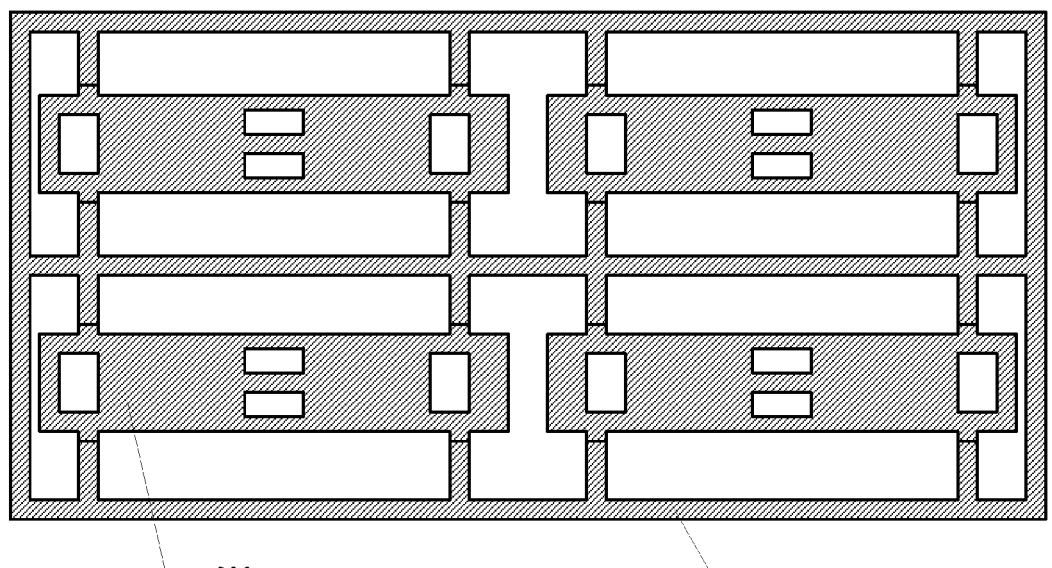

Referring now to FIGS. 2A and 2B, a plane view of an exemplary upper and lower lead frame, in accordance with one embodiment of the present technology, is shown. The lower lead frame includes one or more leads 210-220, for each of a plurality of die, coupled by one or more tie bars 225. The upper lead frame also includes one or more leads 230 coupled by one or more tie bars 235. In one implementation, the lower lead frame may include a source lead, a gate lead and a lower portion of a drain lead for each die, and the upper lead frame may include an upper portion of a drain lead for each die. Each set of a source lead, gate lead and lower portion of a drain lead in the lower lead frame is typically referred to as a panel. Similarly, each upper portion of the drain lead in the upper lead frame is typically referred to as a panel. The lead frame normally includes a large array of panels. In one implementation, the upper and lower lead frames may be made formed from a sheet of copper alloy 194 that is approximately 0.006 to 0.012 inches thick. The pattern of the leads and tie bars may be formed by etching, punching, stamping and/or the like.

In one implementation, the lower lead frame may be partially etched to form a plurality of raised mesas on the source and/or gate leads. The etching process may also be used to form cavities in the lower portion of the drain leads. The mesas and cavities may be formed by etching the copper alloy of the lower lead frame with a chemical solution to a thickness of approximately one half of its original thickness. Alternatively, the mesas and cavities may be formed by progressive stamping. Different patterns of raised mesas may be formed on the lower lead frame. In one implementation, the upper lead frame may be partially etched to form one or more grooves (not shown) on the lower surface. The groves may improve the compliance of the upper lead with the semiconductor die during thermal cycles. In one implementation, the groves may be formed as one or more parallel and/or perpendicular grooves. However, it should be noted that forming too many grooves in the upper leads may increase the risk of dies cracking during the molding process, because the flat central portion of the upper lead protects the die from differential forces that might crack the die during molding.

Figure 3A:
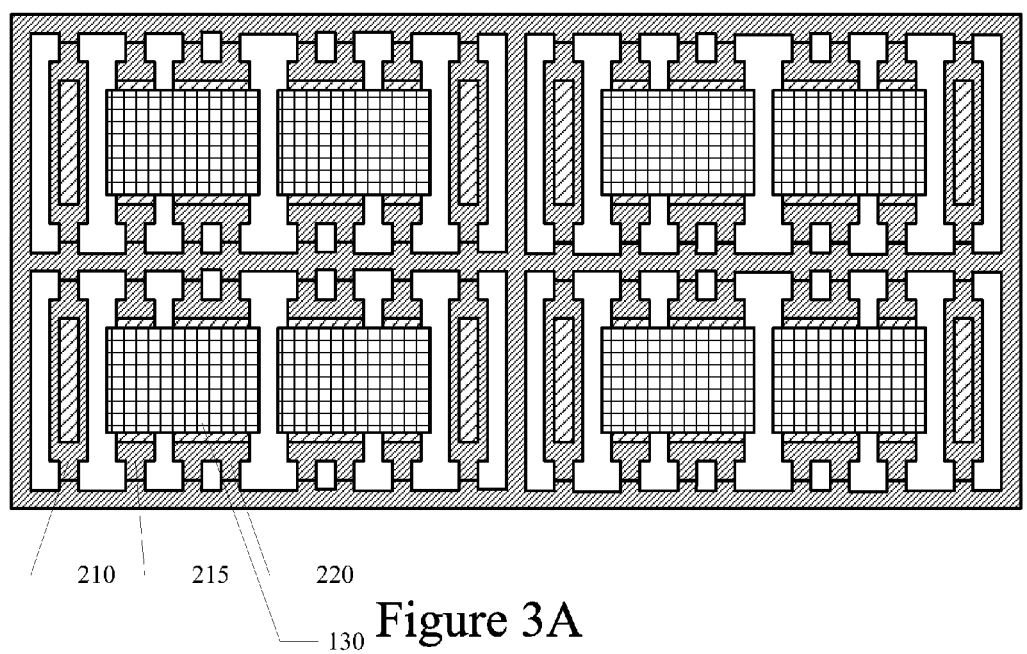
FIGS. 3A and 3B show a top and side view of coupling a plurality of die to the lower lead frame, in accordance with one embodiment of the present technology.
Figure 3B:
Figure 6:
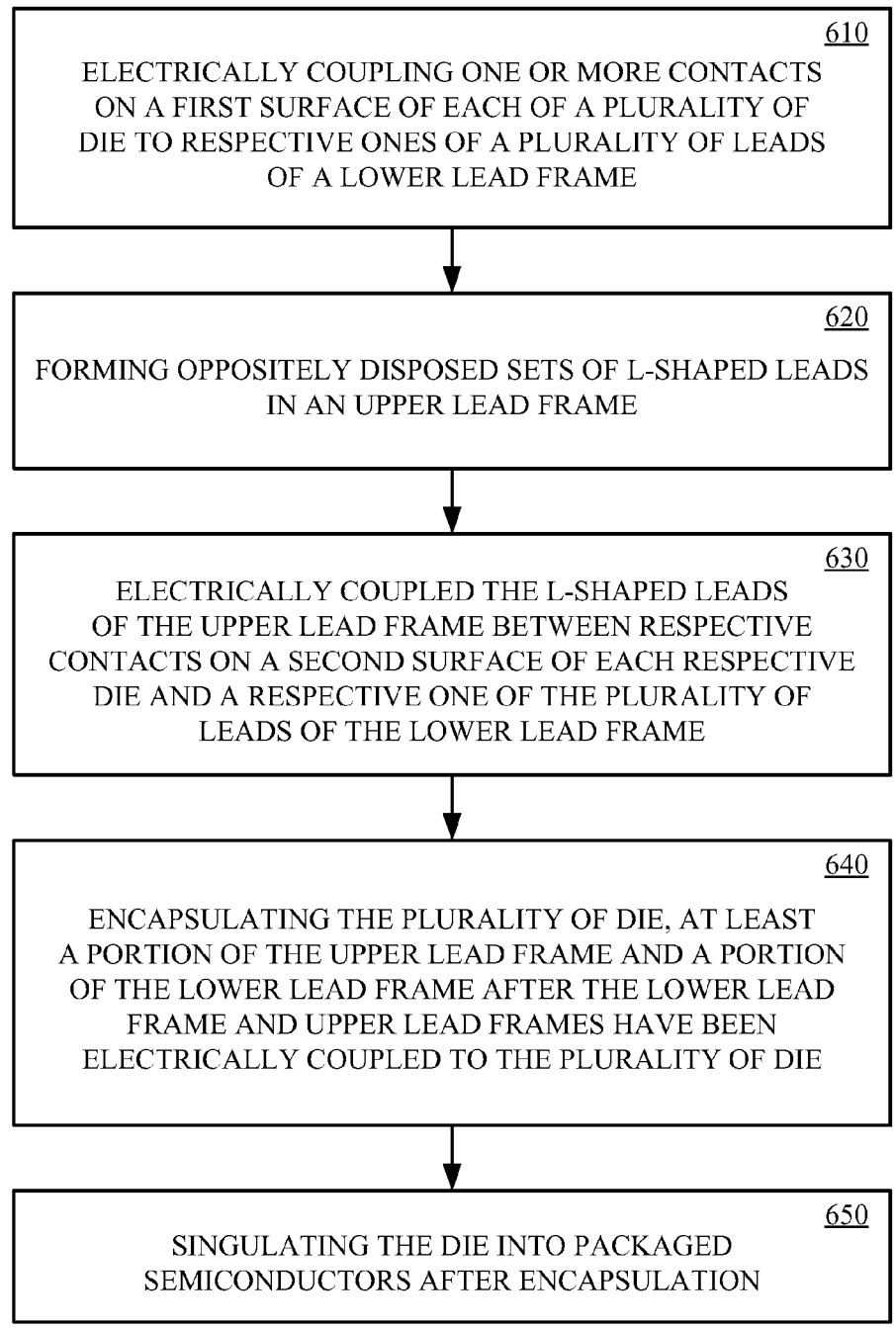
FIG. 6 shows a flow diagram of a method of manufacturing a packaged semiconductor device, in accordance with one embodiment of the present technology.

Referring now to FIGS. 3A and 3B, a top and side view of coupling a plurality of die to the lower lead frame, in accordance with one embodiment of the present technology, is shown. The semiconductor packaging technique will be further described herein with reference to FIG. 6, which shows a method of manufacturing a packaged semiconductor device. In one implementation, the die may be a vertical trench MOSFET with a drain terminal on the top surface of the die and a source and gate terminal on the lower surface of the die. One or more leads 210-22 of the lower lead frame are electrically coupled to respective terminals on the die 130 by a conductor such as a solder layer, at 610. In one implementation, the leads are coupled to the terminal of the die by a solder reflow process after solder paste is applied to the source and gate leads. In one implementation, the solder layer extends from the top surfaces of mesas on the source and gate leads to respective contacts on the die. The solder layer may also be applied to the lower portion of the drain lead at the same time as it is applied to the source and gate leads and may flow into the groove in the lower portion of the drain lead when the solder layer is reflowed to coupled the source and gate leads to the respective terminals of the die.

Figure 4A:
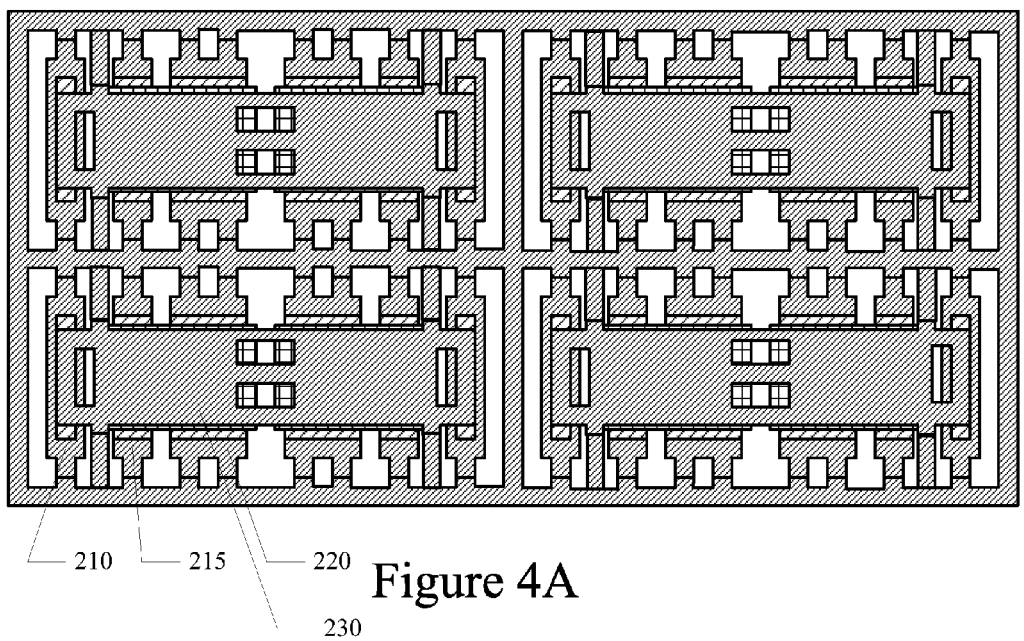
FIGS. 4A and 4B show a top and side view of coupling the upper lead frame to the lower lead frame and the plurality of die, in accordance with one embodiment of the present technology.
Figure 4B:
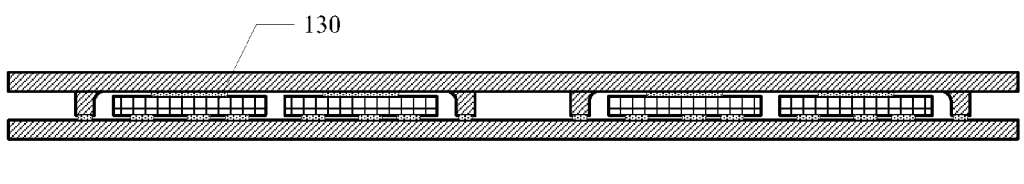

Referring now to FIGS. 4A and 4B, a top and side view of coupling the upper lead frame to the lower lead frame and the plurality of die, in accordance with one embodiment of the present technology, is shown. Before coupling, one or more edges of the leads of the upper lead frame are bent to form 'L' shaped leads for contact one or more leads of the lower lead frame, at 620. In one implementation, the opposite edges of each pair of leads, coupled together by the second set of tie bars, in the upper lead frame are bent to form 'L' shaped upper portions of drain leads.

At 630, each lead of the upper lead frame is electrically coupled to respective terminals on a set of die by a conductor such as a solder layer. In addition, the bent edges of the leads are coupled to respective leads on the lower lead frame. In one implementation, the edges of the upper portion of the drain leads are electrically coupled to respective lower portions of the drain leads of the lower lead frame. In one implementation, the upper portion of the drain leads are coupled to corresponding terminals of the die and the lower portion of the drain leads by a solder reflow process after solder paste is applied to the terminals of the die and the lower portion of the drain leads of the lower lead frame.

In one implementation, the relative thickness of the solder layer coupling the upper lead frame to the die and the thickness of the solder layer coupling the lower lead frame to the die are set such that the resulting package is able to undergo numerous thermal cycles without fracture or cracks in either solder layer. Generally, the upper solder layer is thinner than the lower solder layer because the upper solder layer has a wider area of contact between the leads of the upper lead frame and the die. The relative proportions between the thickness of the upper solder layer and the lower solder layer may be achieved by a double-reflow process. In accordance with this process, drops of a solder past are first applied to the lower lead frame, typically on the tops of the mesas. The die are then placed onto the solder paste drops, and the solder past is reflowed. After the solder that connects the die with the lower lead frames has been reflowed, solder past drops are applied to the top side of the die. At the same time, solder paste may also be placed on the portions of the lower lead frames that will be coupled to the bent portions of the leads of the upper lead frame. The upper lead frame is placed into position over the die, resting on the solder paste drops on the backside of the die and then a second reflow process is performed. As the solder past reflows, the die are lifted from the lower lead frame to a position intermediate between the upper lead frame and the lower lead frame. This lifting of the die occurs as a result of the surface tension of the solder. By regulating the amount of solder paste that is applied to the lower lead frame and the upper lead frame, respectively, the desired position of the die may be further achieved. Typically, the ratio of the thickness between the upper solder layer and the lower solder layer is in the range of 1:1.5 to 1:4. For example, in one implementation, the upper solder layer may be 1.1 mils thick and the lower solder layer may be 2.8 mils thick.

The assembly including the lower lead frame, plurality of die, and upper lead frame, after solder is applied, is then be encapsulated, at 640. In one implementation, the assembly is placed in a mold that is then filled with a molding compound, such as Nitto 8000CH4. In one implementation, the upper surface of the panels from the upper lead frame may be left exposed by the encapsulant to maximize head transfer from the package.

The encapsulated panels of the upper lead frame, die and lower lead frame are then separated by severing the tie bars of the lower and upper lead frames, at 650. The upper lead of each packaged die has a substantially 'L' shape. In one implementation, the die are separate by cutting through the encapsulant and tie bars of the upper and lower lead frame between the die to form the packaged semiconductor device.

Figure 5:
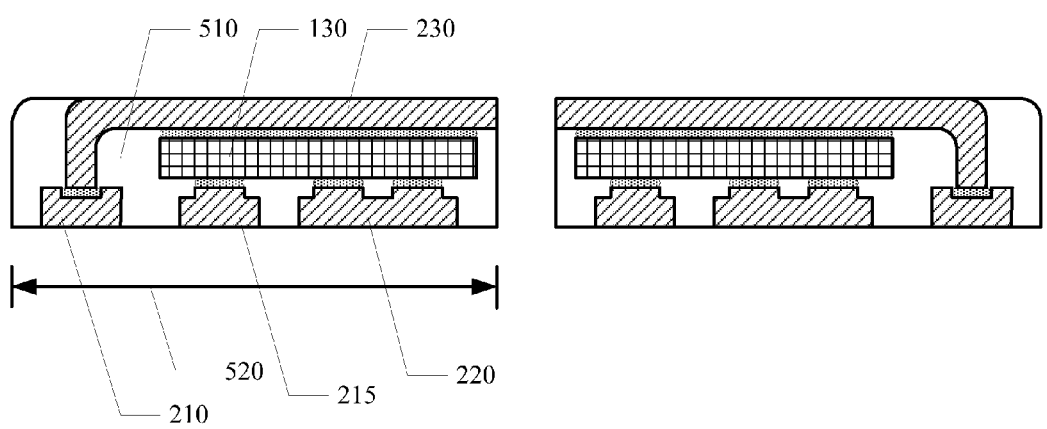
FIG. 5 shows a side view of an exemplary packaged semiconductor device, in accordance with one embodiment of the present technology.

Referring now to FIG. 5, an exemplary packaged semiconductor device, in accordance with one embodiment of the present technology, is shown. After singulation, each package semiconductor includes a die 130 electrically coupled to one or more of a plurality of lower leads 215, 220, an 'L' shaped upper lead 230 electrically coupled between the die 130 and another one of the plurality of lower leads 210, an encapsulant 510. The upper lead is coupled to a lower lead on one side and is not coupled to another lower lead on the other side of the die. Therefore, the semiconductor device, in accordance with embodiments of the present technology, have a smaller package size 520 as compared to similar semiconductor packages according to the conventional art. It is also to be appreciated, different sawing arrangements may be utilized to produce different paired packages with different lead layouts (e.g., pin outs).

The resulting package advantageously provides excellent electrical and thermal conductivity between the terminals on the top and bottom sides of the die and the upper and lower lead frames respectively. The contacts from the terminals on the top and bottom side of the die are advantageously located in a single plane of the package for surface mounting on a printed circuit board or other flat surface. The package can advantageously be made thin and compact and is able to withstand numerous thermal cycles without solder or die cracking. Embodiments of the present technology advantageously support the upper lead without the need for an additional lower lead in each package.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:

1. A method of packaging a semiconductor comprising:
   electrically coupling a contact on a first surface of each of a plurality of die to a respective first one of a plurality of leads of a lower lead frame, wherein the plurality of leads of the lower lead frame are coupled together by one or more tie bars of the lower lead frame;
   bending opposite edges of each corresponding set of two or more leads of a plurality of leads of an upper lead frame while the adjacent edges of each corresponding set of two or more leads are coupled together by one or more tie bars of the upper lead frame, wherein each of the plurality of leads is bent into an L-shape, wherein the bent opposite edges of each corresponding set of leads of the upper lead frame support the upper lead frame from the lower lead frame at a desired position with respect to the plurality of die, and wherein the plurality of leads of the upper lead frame are coupled together by one or more additional tie bars of the upper lead frame; and
   electrically coupling the leads of the upper lead frame between respective contacts on a second surface of each respective die and a respective second one of the plurality of leads of the lower lead frame.

2. The method according to claim 1, further comprising:
   encapsulating the plurality of die, at least a portion the upper lead frame and a portion of the lower lead frame after the lower lead frame and upper lead frames have been electrically coupled to the plurality of die; and
   singulating the die into packaged semiconductors after encapsulation.

3. The method according to claim 2, wherein singulating the die comprises cutting through the encapsulant, the tie bars coupling the leads of the lower lead frame, and the tie bars coupling the leads of the upper lead frame to separate the plurality of die into the packaged semiconductors.

4. The method according to claim 2, wherein the leads of the upper lead frame are electrically coupled at a cavity of the respective second one of the plurality of leads of the lower lead frame.

5. The method according to claim 2, wherein the leads of the upper lead frame are electrically coupled to the contacts on the second surface of each respective die proximate one or more grooves in the leads of the upper lead frame.

6. The method according to claim 1, wherein:
   surface of each of the plurality of die to the respective first one of the plurality of leads of the lower lead frame comprises reflowing solder applied between the first surface of each of the plurality of dies and the respective first one of the plurality of leads of the lower lead frame; and
   electrically coupling the leads of the upper lead frame between respective contacts on the second surface of each respective die and the respective second one of the plurality of leads of the lower lead frame comprises reflowing solder applied between the leads of the upper lead frame and the second surface of each respective die and the respective second one of the plurality of leads of the lower lead frame.

7. The method according to claim 6, wherein a ratio of a thickness of the solder coupling the upper lead frame to the die and the thickness of the solder layer coupling the lower lead frame to the die is regulated to provide a desired position of the plurality of die between the lower lead frame and upper lead frame.

8. The method according to claim 1, wherein:
   each of the first one of the plurality of lower leads of the lower lead frame is electrically coupled to a respective gate of the plurality of die;
   each of the upper lead of the upper lead frame is electrically coupled to a respective drain of the plurality of die;
   each of the second lower lead of the lower lead frame is electrically coupled to the respective drain of the plurality of die through the respective upper lead; and
   each of a third lower lead of the lower lead frame is electrically coupled to a respective source of the plurality of die.

9. The method according to claim 1, wherein the upper leads of the upper lead frame are not coupled to another lower lead of the lower lead frame.

10. The method according to claim 1, wherein the contact on the first surface of the plurality of die are electrically coupled at a mesa portion of the respective first one of the plurality of leads of the lower lead frame.

11. A method of packaging a semiconductor comprising:
    electrically coupling a contact on a first surface of each of a plurality of die to a respective first one of a plurality of leads of a lower lead frame, wherein the plurality of leads of the lower lead frame are coupled together by one or more tie bars;
    forming oppositely disposed sets of two L-shaped leads in an upper lead frame such that bent edges of each set of two L-shaped leads are opposite each other, wherein the L-shaped leads of the upper lead frame are coupled together by one or more tie bars; and
    electrically coupling the L-shaped leads of the upper lead frame between respective contacts on a second surface of each respective die and a respective second one of the plurality of leads of the lower lead frame.

12. The method according to claim 11, wherein the upper leads of the upper lead frame are not coupled to another lower lead of the lower lead frame.

13. The method according to claim 11, further comprising:
    encapsulating the plurality of die, at least a portion the upper lead frame and a portion of the lower lead frame after the lower lead frame and upper lead frames have been electrically coupled to the plurality of die; and
    cutting through the encapsulant, the tie bars coupling the leads of the lower lead frame, and the tier bars coupling the leads of the upper lead frame to separate the plurality of die into packaged semiconductors.

14. The method according to claim 13, further comprising cutting through the encapsulant, the tie bars coupling the leads of the lower lead frame, and the tier bars coupling the leads of the upper lead frame in multiple patterns to produce multiple different lead layouts.

15. The method according to claim 11, wherein:
   electrically coupling the contacts on the first surface of each of the plurality of die to the respective first one of the plurality of leads of the lower lead frame comprises reflowing solder applied between the first surface of each of the plurality of dies and the respective first one of the plurality of leads of the lower lead frame; and
   electrically coupling the leads of the upper lead frame between respective contacts on the second surface of each respective die and the respective second one of the plurality of leads of the lower lead frame comprises reflowing solder applied between the leads of the upper lead frame and the second surface of each respective die and the respective second one of the plurality of leads of the lower lead frame.

16. The method according to claim 15, wherein a ratio of a thickness of the solder coupling the upper lead frame to the die and the thickness of the solder layer coupling the lower lead frame to the die is regulated to provide a desired position the plurality of die between the lower lead frame and upper lead frame.

* * * * *